(12) United States Patent
Suuronen et al.

(10) Patent No.: US 9,953,849 B2
(45) Date of Patent: Apr. 24, 2018

(54) PLATEN FOR REDUCING PARTICLE CONTAMINATION ON A SUBSTRATE AND A METHOD THEREOF

(71) Applicant: Varian Semiconductor Equipment Associates, Inc., Gloucester, MA (US)

(72) Inventors: David E. Suuronen, Newburyport, MA (US); Dale K. Stone, Lynnfield, MA (US); Shigeo Oshiro, Gloucester, MA (US); Arthur P. Riaf, Gloucester, MA (US); Edward D. MacIntosh, Amesbury, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 622 days.

(21) Appl. No.: 14/224,879

(22) Filed: Mar. 25, 2014

(65) Prior Publication Data

US 2015/0279704 A1   Oct. 1, 2015

Related U.S. Application Data

(62) Division of application No. 12/487,444, filed on Jun. 18, 2009, now Pat. No. 8,681,472.

(60) Provisional application No. 61/074,169, filed on Jun. 20, 2008.

(51) Int. Cl.
*H01L 21/67*     (2006.01)
*H01L 21/687*    (2006.01)

(52) U.S. Cl.
CPC .... *H01L 21/67109* (2013.01); *H01L 21/6875* (2013.01)

(58) Field of Classification Search
CPC .. H01L 23/46; H01L 23/473; H01L 21/67109
USPC ........................................................ 165/80.4
See application file for complete search history.

(56) References Cited

U.S. PATENT DOCUMENTS

2004/0046539 A1* 3/2004 Rhoads ............. H01J 37/32412
                                                    323/355
2009/0317964 A1* 12/2009 Suuronen ................ H01J 37/20
                                                    438/514

* cited by examiner

*Primary Examiner* — Walter H Swanson

(57) ABSTRACT

Techniques for reducing particle contamination on a substrate are disclosed. In one particular exemplary embodiment, the technique may be realized with a platen having different regions, where the pressure levels in the regions may be substantially equal. For example, the platen may comprise a platen body comprising first and second recesses, the first recess defining a fluid region for holding fluid for maintaining a temperature of the substrate at a desired temperature, the second recess defining a first cavity for holding a ground circuit; a first via defined in the platen body, the first via having first and second openings, the first opening proximate to the fluid region and the second opening proximate to the first cavity, wherein pressure level of the fluid region may be maintained at a level that is substantially equal to pressure level of the first cavity.

13 Claims, 7 Drawing Sheets

PLATEN FOR REDUCING PARTICLE CONTAMINATION ON A SUBSTRATE AND A METHOD THEREOF

PRIORITY

This application is a divisional application of U.S. Non-provisional patent application Ser. No. 12/487,444, filed on Jun. 18, 2009, entitled "Platen ground pin for connecting substrate to ground," and now patented as U.S. Pat. No. 8,681,472, which claims priority to U.S. Provisional Patent Application Ser. No. 61/074,169, filed on Jun. 20, 2008, entitled "An Apparatus for reducing particle contamination and a method thereof." The entire specification of U.S. Provisional Application 61/074,169 and the entire specification of U.S. Non-provisional patent application Ser. No. 12/487,444 are incorporated herein by reference.

FIELD

The present disclosure relates to a platen an apparatus for supporting a substrate and, more particularly, to a platen for reducing particle contamination during processing of the substrate and a method thereof.

BACKGROUND

Ion implantation or doping is one of several processes performed for, among others, manufacturing electronic devices. As known in the art, a beam-line ion implantation system may be used to perform ion implantation. A block diagram of a conventional ion implanter is shown in FIG. 1. The conventional ion implantation system 100 may comprise an ion source 104; a plurality of beam-line components; and an end station. As known in the art, the ion source 104 may be used to generate ions of desired species 102. The generated ions may be extracted from the ion source 104 by the beam-line components 105. Much like a series of optical lenses that manipulate a light beam, the beam-line components 105 manipulate the ions 102 into an ion beam 102 and steer the beam 102 towards an end station 110 where a wafer 106 and a platen 108 supporting the wafer 106 are located. The ion beam directed toward the end station is incident on the wafer 106 and ion implantation may be performed.

The ion implantation may also be performed using a system known as a plasma doping ("PLAD") or plasma immersion ion implantation ("PIII") system. In the PLAD system, the wafer 106 and the platen 108 supporting the wafer 106 are placed in a process chamber. Meanwhile, process gas containing a desired species is into a plasma source of PLAD system 200. In some systems, the plasma source is adjacent to the process chamber. In other systems, the plasma source is removed and remote from the process chamber. The process gas is then converted into plasma 210 containing electrons, ions 202 of the desired species, neutrals, and/or residuals. The wafer 106 may be biased, and ions 202 of the desired species may be implanted into the wafer 106.

The platen 108 may be used to support the wafer 106 during ion implantation. The platen 108 may comprise a plurality of electrodes (not shown) that electrostatically clamp the wafer 106 to the platen 108. In some cases, platen 108 may enable the wafer 106 to move in several directions (e.g. translate, rotate, tilt, etc. . . . ).

The platen 108 may be used to control several ion implantation parameters. For example, the platen 108 may be used to maintain the temperature of the wafer 106 at a desired level. Because the ion implantation process is an energetic process, temperature of the wafer 106 may be elevated to a level beyond that is desired. Generally, the platen 108 is used to prevent overheating of the substrate. The conventional platen may have a cooling recess (not shown) which, along with the mounted wafer 106, may define a cooling region (not shown). Cooling gas may be introduced into the cooling region and maintained at a predetermined pressure such that the gas may contact the wafer 106 and cool the wafer 106.

Another implant parameter that can be controlled using the platen 108 includes preventing excessive charge buildup in the wafer 106. As known in the art, excessive charge may build up in the wafer 106 as the wafer 106 is bombarded with charged ions. Excessive charge buildup may cause arcing and lead to catastrophic failure of the wafer 106. In addition, the charge buildup may hinder the wafer 106 from being declamped from the platen 108 after completion of the ion implantation process. To avoid excess charge buildup, the wafer 106 and 206 may contain one or more ground circuits (not shown) that electrically connects the wafer 106 to the ground and reduce excessive charge buildup.

In the conventional platen 108, parts of the platen 108 directly contact the wafer 106. Such contacts may generate debris. The debris may drift to the front side of the wafer 106, the side on which the ion beam is incident. Debris near the front side of wafer 106 may be disadvantageous as the debris may interfere with the implantation process and, ultimately, contribute to less than optimum devices. Accordingly, an improved platen is needed.

SUMMARY

Techniques for reducing particle contamination on a substrate are disclosed. In one particular exemplary embodiment, the technique may be realized with a platen having different regions, where the pressure levels in the regions may be substantially equal. For example, the a platen may comprise a platen body comprising first and second recesses, the first recess defining a fluid region for holding fluid for maintaining a temperature of the substrate at a desired temperature, the second recess defining a first cavity for holding a ground circuit; a first via defined in the platen body, the first via having first and second openings, the first opening proximate to the fluid region and the second opening proximate to the first cavity, wherein pressure level of the fluid region may be maintained at a level that is substantially equal to pressure level of the first cavity.

In accordance to another aspect of this particular exemplary embodiment, the fluid region may be in pressure equilibrium with the first cavity.

In accordance to further aspect of this particular exemplary embodiment, the fluid region may be in fluid communication with the first cavity.

In accordance with additional aspect of this particular exemplary embodiment, the platen may further comprise a fluid channel, where the fluid region may be in fluid communication with the first cavity through the fluid channel.

In accordance with yet additional aspect of this particular exemplary embodiment, the fluid channel may be provided in the platen body.

In accordance with yet another aspect of this particular exemplary embodiment, the fluid channel may be provided in the ground circuit.

In accordance with still another aspect of this particular exemplary embodiment, the ground circuit may comprise a ground pin having a pin body and a sleeve, and the fluid channel may be provided in the sleeve.

In accordance with another aspect of this particular exemplary embodiment, the ground circuit may comprise a ground pin having a pin body and a sleeve, where the fluid channel may be provided in the pin body.

Yet in accordance with another aspect of this particular exemplary embodiment, the ground circuit may comprise a ground pin having a pin body and a porous sleeve, where the fluid channel may be provided in the porous sleeve In accordance to another aspect of this particular exemplary embodiment, the fluid channel may be in a form of a groove.

Still in accordance to another aspect of this particular exemplary embodiment, the ground circuit may comprise a ground pin having a pin body and a sleeve, where the fluid channel may be in a form of a groove, and where the groove may be provided in the sleeve.

In accordance to additional aspect of this particular exemplary embodiment, the groove may extend in one direction.

In accordance to still another aspect of this particular exemplary embodiment, the groove may be a helical groove.

In another particular exemplary embodiment, a ground pin for connecting a substrate to ground may comprise a pin body; and a sleeve supporting the pin body, where the sleeve may include a fluid channel for which fluid may be transported.

In accordance to another aspect of this particular exemplary embodiment, the fluid channel may be in a form of a groove disposed on at least one of outer and inner surfaces of the sleeve.

In accordance to additional aspect of this particular exemplary embodiment, the fluid channel may be in a form of a via disposed between outer and inner surfaces of the sleeve.

Yet in accordance to another particular aspect of this particular exemplary embodiment, the groove is a helical groove.

Yet in accordance to additional particular exemplary embodiment, the technique may be realized by loading the substrate on a platen; introducing fluid to a fluid region adjacent to the substrate and a platen body of the platen; maintaining the fluid region at a first pressure level; and maintaining a first cavity defined by the platen body at a second pressure level, the second pressure level being substantially equal to the first pressure level.

In accordance to another aspect of this particular exemplary embodiment, the technique may further comprise providing a fluid channel, wherein the fluid region is in fluid communication with the first cavity through the fluid channel.

Yet in another aspect of this particular exemplary embodiment the platen may comprise a platen body, where the fluid region and the first cavity may be spaced apart by the platen body, and where the fluid channel may be provided in the platen body.

In accordance to additional aspect of this particular exemplary embodiment, the technique may further comprise providing a ground pin for connecting the substrate to ground, where the fluid channel may be provided in the ground pin.

In accordance to yet additional aspect of this particular exemplary embodiment, the ground pin may further comprise a pin body and a sleeve, wherein the fluid channel may be provided in the sleeve.

In accordance to still additional aspect of this particular exemplary embodiment, the fluid channel may be in a form of a groove disposed on outer surface of the sleeve.

In accordance to still another aspect of this particular exemplary embodiment, the groove may be a helical groove.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings. These figures may not necessarily be drawn to scale. In addition, these figures should not be construed as limiting the present disclosure, but are intended to be exemplary only.

DESCRIPTION

To solve aforementioned problems, several embodiments of a platen for reducing particle contamination while processing a substrate and a method thereof are introduced. For purpose of clarity and simplicity, the present disclosure focuses on a platen, and components thereof, implemented in an ion implantation system. However, those skilled in the art will recognize that the present disclosure may be equally applicable to other systems, and components thereof. For example, the present disclosure may be equally applicable to other types of substrate support, and components thereof, in an etch system, a deposition system, an annealing system, or other optical based processing systems. In addition, the present disclosure is made in context to a term "substrate." Those of ordinary skill in the art will recognize that the substrate may contain a metal, a semiconductor, an insulator, or a combination thereof.

Figure 1:
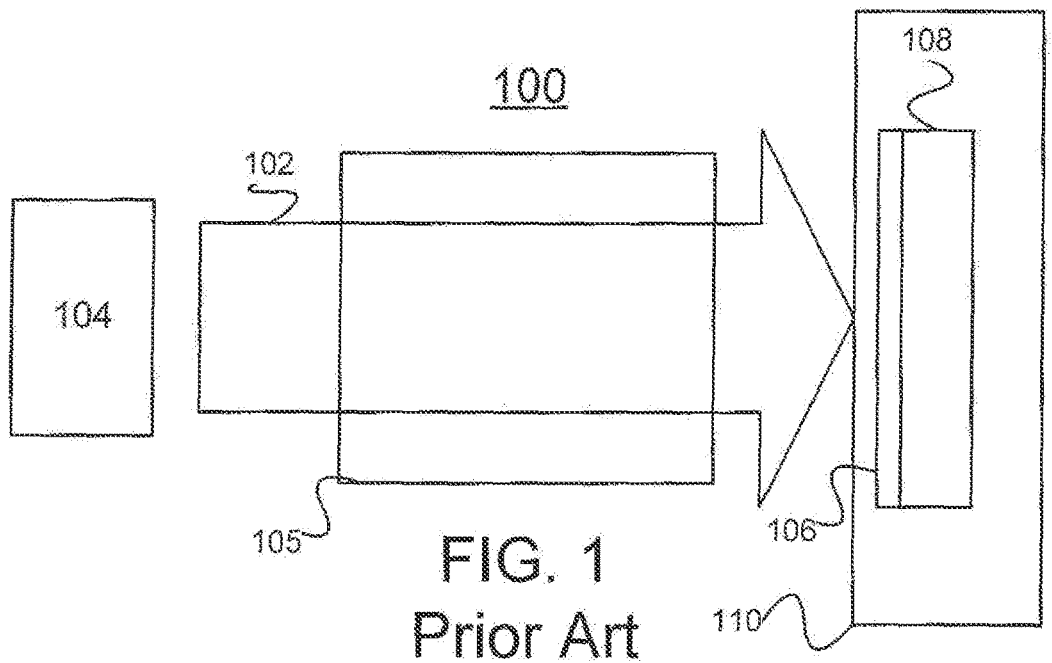
FIG. 1 is a block diagram illustrating a conventional beam-line ion implantation system.
Figure 2:
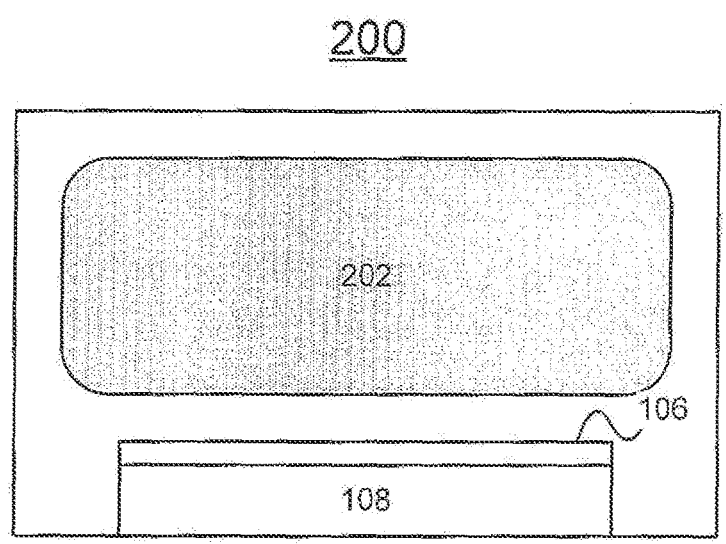
FIG. 2 is a block diagram illustrating a conventional PLAD or PIII system.
Figure 3A:
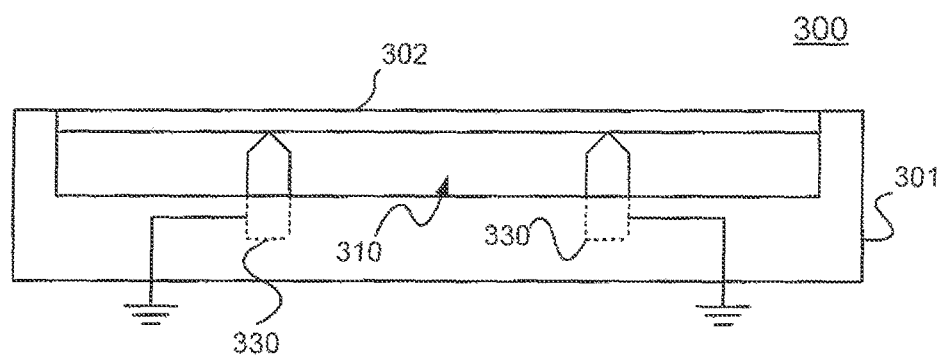
FIG. 3A is a block diagram illustrating a platen comprising one or more ground circuits according to one embodiment of the present disclosure.

Referring to FIG. 3a, there is shown a cross sectional view of a platen for reducing particle contamination on a substrate, according to one embodiment of the present disclosure. The platen in the present embodiment may be a platen 300 supporting the substrate 302 during various processes. The platen 300 may be made from an electrically conducting material such as, for example, aluminum ("Al"). However, it is also contemplated that the platen 300 may be made from other electrical conducting materials. The platen 300 made from an insulator, although not desirable, is, however, not precluded.

As illustrated in FIG. 3a, the platen 300 may comprise a platen body 301 and one or more ground circuits 330 electrically coupling the substrate 302 to the ground. The platen body 301 comprises a first recess defining one or more fluid regions 310. The fluid region 310 may contain fluid to maintain a substrate 302 at a desired temperature. For example, if it is desirable to maintain the substrate 302 at a low temperature, cooling fluid may be introduced to the fluid region 310 to cool the substrate 302 while the substrate 302 is being processed. On the other hand, if it is desirable to maintain the substrate 302 at a high temperature, heating fluid may be introduced to the fluid region 310 to heat the substrate 302.

Figure 3B:
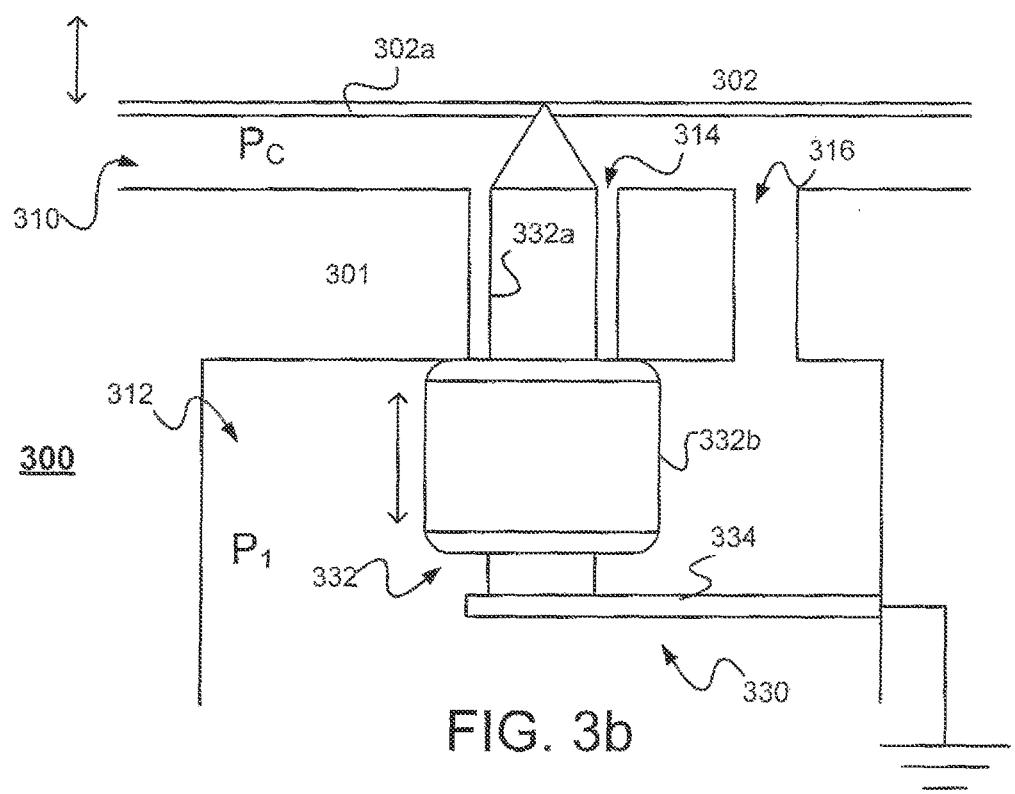
FIG. 3B is a detailed view of the platen near the ground circuit according to one embodiment of the present disclosure.

Referring to FIG. 3b, there is shown a more detailed view of the platen body 301 proximate to the ground circuit 330. In addition to the first recess defining the fluid region, the platen body 301 may also comprise a second recess defining a first cavity 312, and first and second vias 314 and 316 coupling the fluid region 310 and the first cavity 312. The ground circuit 330, meanwhile, may comprise a ground electrode 334 and a ground pin 332, where the ground pin has a pin body 332a and a sleeve 332b. As illustrated in the figure, the ground electrode 334 and the sleeve 332b is disposed in the first cavity 312. Meanwhile, the pin body 332a may extend from the first cavity 312 to the fluid region 310 through the first via 314.

In the present disclosure, the pin body 332a may preferably have a sharp end to penetrate a dielectric film 302a generally deposited on the back side of the substrate 302, to contact the substrate 302. To provide electrical contact, the pin body 332a of the present disclosure may be made with one or more electrically conducting materials, for example, tungsten carbide ("WC"). The sleeve 332b, meanwhile, may be electrically insulating. The sleeve 332b may preferably comprise one or more insulating or dielectric materials including, for example, rubber, polymer, and dielectric ceramic, or a combination thereof. Although the sleeve 336 may preferably be insulating, sleeve 336 that can conduct electricity is also contemplated in the present disclosure.

As illustrated in FIG. 3b, the sleeve 332b may be positioned on the pin body 332a. In addition, the sleeve 332b may be in contact with the platen body 301 near the opening of the first via 314. The sleeve 332b may be shaped and dimensioned to provide support to the pin body 332a and prevent the pin body 332a from protruding excessively into the fluid region 310. For example, the cross sectional dimension (i.e. the distance between the center to the outer periphery) of the sleeve 332b may be greater than the cross sectional dimension of the first via 314. Excessive protrusion in the fluid region 310 may damage the substrate.

To provide ground to the substrate, the ground electrode 332 is coupled to the ground pin 332. The ground electrode 334 may preferably enable the ground pin 332 to move in a vertical direction. To achieve electrical conductivity and vertical movement, the ground electrode 334 may have a spring board configuration. One end of the ground electrode 334 may supported, whereas the other end of the ground electrode 334, the end in contact with the ground pin 332, may be without a support. However, support may be provided to the end in contact with the ground pin 332. In addition, the ground electrode 334 may comprise one or more flexible, electrically conducting material. For example, the ground electrode 340 may be made with a material such as, for example, copper ("Cu"). Those of ordinary skill in the art will recognize that the ground electrodes 334 with other configurations and other materials are also possible. For example, it is also within the present disclosure that the ground electrode 334 may have a helical coil configuration and/or made from an alloy, such as Be—Cu alloy, or, if preferable, a composite. The electrode 334 may also be made from a shape memory alloy capable of recovering its original shape after deformation induced by stress.

In operation, the substrate 302 is loaded onto the platen 300, clamped, and processed. The platen 300 may be an electrostatic clamping platen 300, and one or more clamping electrodes (not shown) may be activated to clamp the substrate 302 to the platen 300. Alternatively, the platen 300 may be a mechanical clamping platen 300, and the substrate 302 may be mechanically clamped to the platen 300. The ground pin 332 is then pressed against the substrate 302, penetrates the dielectric film 302a, and intimately contacts the substrate 302.

To maintain the substrate at a desired temperature, fluid may be introduced to the fluid region 310. As noted above, fluid may be introduced to provide cooling or heating. In addition, fluid is maintained in the fluid region 310 at a desired pressure level or within a range of a desired pressure range $P_C$. After the substrate is processed, the substrate 302 may be declamped from the platen 300 and removed from the platen 300.

While the substrate is mounted onto the platen 300, debris may be generated as the parts of the platen 300 and the substrate 302 directly contact one another. For example, debris from the substrate 302 and the film 302a may be generated as the substrate 302 and the film 302a intimately contact the sharp end of the pin body 332a. Generated debris may settle and accumulate on the surface of the platen body 301, the pin body 332a, the sleeve 332b, the first cavity 312, and the first via 314. The inventors discovered that such debris may be transported to other location of the end station or toward the front side of the substrate 302. The problem is exacerbated by one or more of sudden bursts of fluid flow between, for example, the fluid region 310 and the first cavity 312. One or more fluid bursts may disturb the debris settled on various surfaces, provide momentum, and transport the debris near the front side of the substrate 302.

The inventors discovered that the fluid bursts may be attributable to pressure differential between the fluid region 310 and the first cavity 312. During operation, the fluid region 310 may be maintained at the desired pressure level $P_C$, whereas the first cavity 312 is maintained at another pressure level $P_1$ different from $P_C$. The inventors discovered that intermittently, the sleeve 322b is separated from the platen body 301 by a vertical movement induced to the ground pin 332 when the pin body 332a is in contact with the substrate 302 or film 302a. In the process, the first via 314, which is generally obstructed by the sleeve 332b, is unobstructed. A sudden burst of fluid may flow between the fluid region 310 and the first cavity 312 due to the difference in $P_C$ and $P_1$.

In the present embodiment, the platen body 301 may comprise the second via 316 that is in fluid communication with the fluid region 310 and the first cavity 312. The second via 316 may provide a fluid channel to which fluid may flow from two regions 310 and 312. In the process, pressure equilibrium between the regions 310 and 312 may be achieved and maintained. For example, fluid from one of the regions 310 and 312 under greater pressure level may flow through the second via 316 to the other one of the regions 310 and 312. In the process, the pressure levels at two regions 310 and 312 may be equal or substantially equal and pressure differential between two regions may be minimized. Even if the sleeve 332b is separated from the platen body 301, thus opening the first via 314, sudden flow of fluid between two regions 310 and 312 may be avoided. The debris settled on various surfaces will less likely to be disturbed and transported near the substrate 302. Those of ordinary skill in the art will recognize that the present disclosure is equally applicable to achieving pressure equilibrium in other regions of the platen that are intermittently in fluid communication with another region and sudden bursts of fluid flows between the regions.

Figure 4:
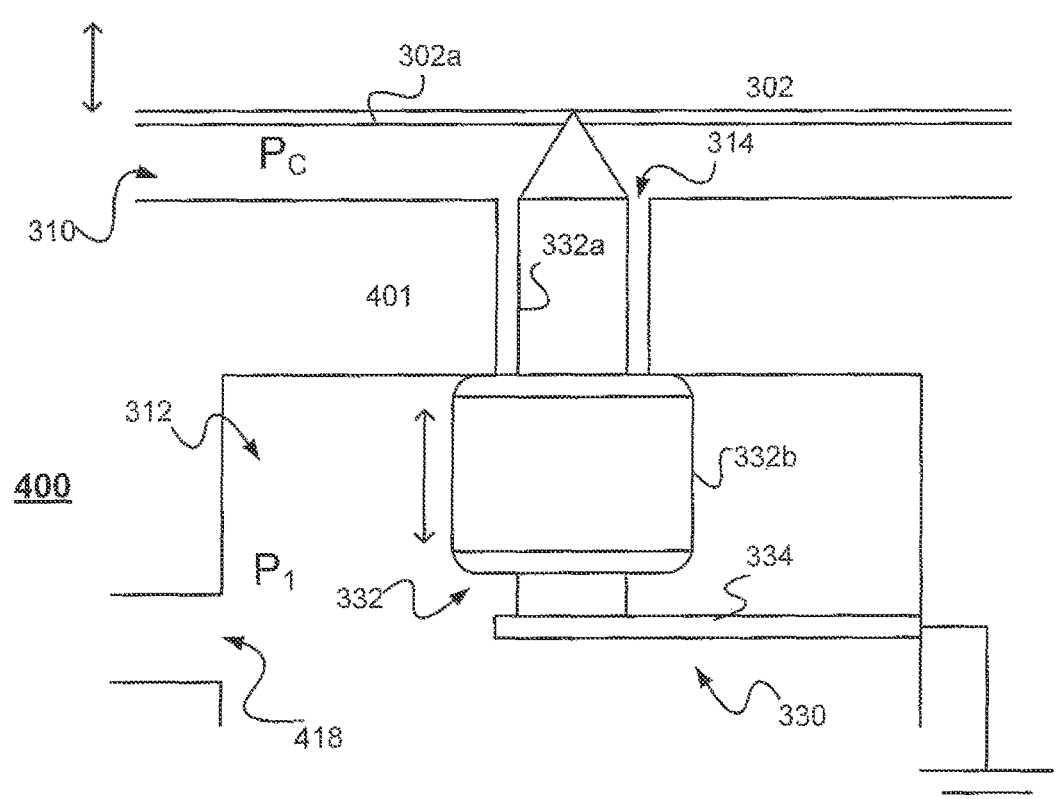
FIG. 4 is a cross sectional view of a platen for reducing particle contamination according to one embodiment of the present disclosure.

Referring to FIG. 4, there is shown a cross sectional view of a platen 400 for reducing particle contamination on a substrate, according to another embodiment of the present disclosure. The platen 400 of the present embodiment is similar to the platen 300 shown in FIG. 3. For purpose of clarity and simplicity, detailed description of similar features is not provided. In addition, same reference numbers are used to refer similar parts.

In the present embodiment, the platen 400 may optionally omit the second via 316 included in the platen body 301 of the earlier embodiment. The platen body 401 of the present embodiment may include a fluid port 418 positioned in the first cavity 312 to minimize pressure differential between the fluid region 310 and the first cavity 312. The fluid port 418 may be coupled to a fluid source (not shown) and/or a vacuum pump (not shown). Further, a pressure monitor (not shown) capable of determining pressure differential between the first cavity 312 and the fluid region 310 may be provided. If the pressure levels in the fluid region 310 and the first cavity 312 are different, fluid may be provided to or evacuated from the first cavity 312 to minimize the pressure differential between the regions 310 and 312.

Figure 5:
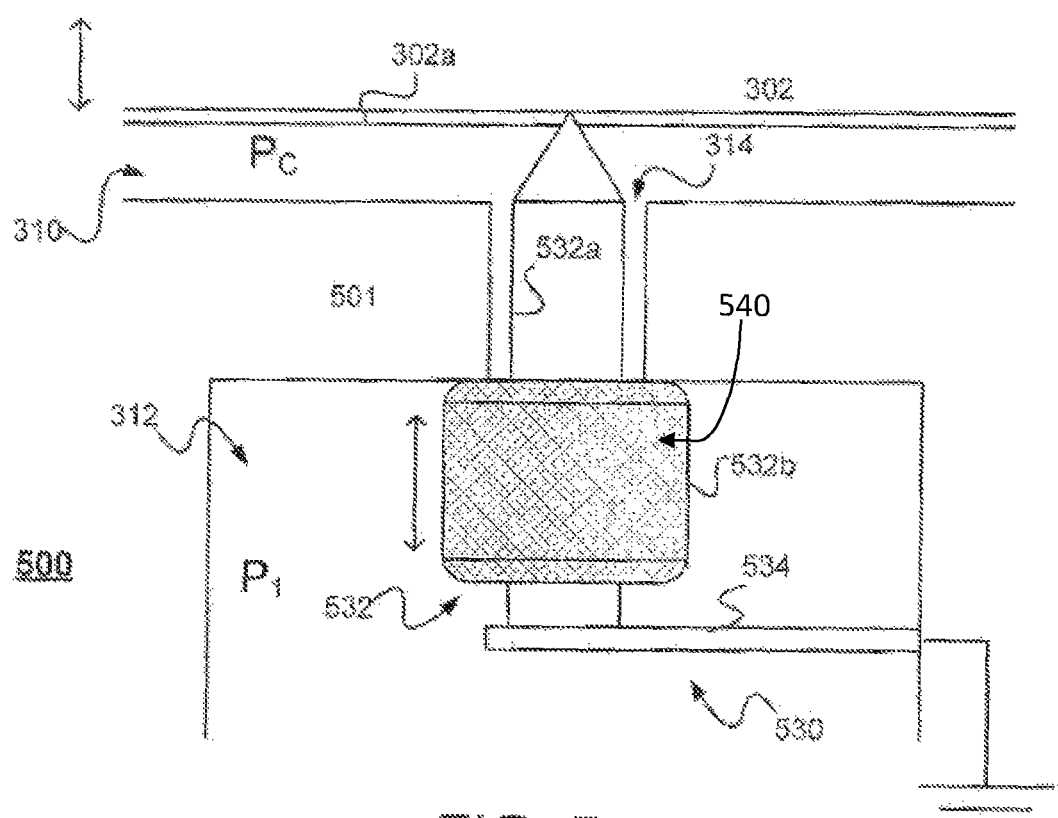
FIG. 5 is a cross sectional view of a platen for reducing particle contamination according to another embodiment of the present disclosure.

Referring to FIG. 5, there is shown a cross sectional view of a platen 500 for reducing particle contamination on a substrate, according to another embodiment of the present disclosure. The platen 500 of the present embodiment is similar to the systems 300 and 400 shown in FIGS. 3 and 4. In the present embodiment, the platen 500 may comprise a platen body 501 which may optionally omit the second cavity 316 and/or a fluid port 318 described in earlier embodiments. For purpose of clarity and simplicity, detailed description of similar features is not provided. In addition, same reference numbers are used to refer similar components.

In the present embodiment, the platen 500 may comprise a ground circuit 530. The ground circuit 500 may comprise a ground electrode 534 and a ground pin 532, where the ground pin 532 includes a pin body 532a and a sleeve 532b. The pin body 532a and the ground electrode 534 may be similar to those described in earlier embodiments. For purpose of clarity, a description of similar features will not be included.

In the present embodiment, the sleeve 532b may be a porous sleeve 532b. The pores 540 in the sleeve 532b of the present embodiment may have a plurality of fluid channels that couple the fluid region 310 and the first cavity 312. The channels in the porous sleeve 532b may allow fluid in the fluid region 310 to flow to the first cavity 312, or vice versa. Those of ordinary skill in the art will recognize that sleeve 532b, although porous, is capable of maintaining its structure to adequately support the pin body 532a.

By providing the ground pin 532 with a porous sleeve 532b, the pressure equilibrium between the fluid region 310 and the first cavity 312 may be achieved. In addition, sudden bursts of fluid flow between two regions 310 and 312 that may disturb and/or distribute the debris may be minimized or avoided. The platen 500 utilizing the ground pin 532 of the present embodiment may have additional advantages. For example, if the fluid channels in the sleeve 532b become obstructed due to heavy use, the ground pin 532 may be replaced with another ground pin 532. The entire platen 500 may need not be replaced or refurbished. Accordingly, maintaining the platen 500 may be much easier and less costly.

Those of ordinary skill in the art will recognize that the ground pin of the present disclosure may have various configurations. Among others, the shape, dimension, and the material of the sleeve of the ground pin may be chosen to adequately support the pin body and to maintain its structure. For example, the sleeve may have a portion with the cross sectional dimension greater than the cross sectional dimension of the first via 314. In the process, the sleeve may prevent the pin body from excessively protruding into the fluid region 310 or excessively impinging on the substrate 302.

In addition, the ground pin may comprise a fluid channel that is in communication with the fluid region 310 and the first cavity 312, either directly or indirectly through another component (e.g. the first via). The fluid channel may be in a form of a groove or a via. The fluid channel, in the form of a groove or a via, may be disposed on the pin body or the sleeve of the ground pin. For example, the fluid channel, in the form of a groove or a via, may be disposed on the sleeve, near the outer surface; within the sleeve; on the sleeve, near the inner surface; on the pin body, near the outer edge of the pin body; and/or within the pin body. The fluid channel of the ground pin may provide pressure equilibrium between the fluid region 310 and the first cavity 312 to minimize the pressure differential, when the ground pin is disposed on the platen body. Hereinafter, several exemplary ground pins which may be incorporated to the platen illustrated in FIGS. 3, 4, and 5 are shown.

Figure 6A:
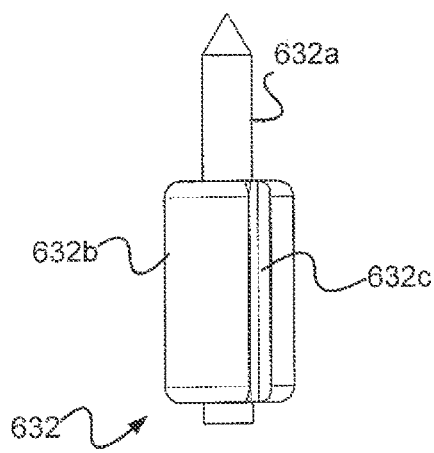
FIG. 6A-6D are views of several exemplary ground pins that can be incorporated into the platens illustrated in FIG. 3-5 according to several embodiments of the present disclosure.

Referring to FIG. 6A-6D, there are shown several exemplary ground pins that may be incorporated into the platen of the present disclosure. As illustrated in FIG. 6A, the ground pin 632 may comprise a pin body 632a, a sleeve 632b, and a fluid channel 632c. In the present embodiment, the fluid channel 632c, in a form of a groove 632c, may be disposed on the sleeve 632b, near the outer surface of the sleeve 632b. However, those of ordinary skill in the art will recognize that the fluid channel 632c may also be in a form of a via. In addition, those of ordinary skill in the art will also recognize that the fluid channel 632c, in the form of a groove or via, may also be disposed within the sleeve 632b, on the inner surface of the sleeve 632, on the outer surface of the pin body 632a, or within the pin body 632a. Further, those of ordinary skill in the art will recognize that the fluid channel 632c need not necessarily extend from the upper surface of the sleeve 632b (i.e. the surface near the sharp end of the pin body 632a) the lower surface of the sleeve 632b (i.e. the surface near the base end of the pin body 632a and a ground electrode). If the ground pin includes a fluid channel that is capable of providing fluid communication to the fluid region 310 and the first cavity 312, the ground pin 632 is within the scope of the present disclosure. For example, a portion of the sleeve 632b, when disposed on the platen body, may extend above the first via 314 and to the fluid region 310. In such a ground pin 632, one end of the fluid channel 632c may be below the upper surface of the sleeve 632b.

In the present embodiment, the fluid channel 632c may have a round concave surface. In another embodiment, the sleeve 632b may have one or more protrusions that convex outwardly (not shown), away from the center of the sleeve 632b. In such an embodiment, one or more fluid channels may be adjacent to the protrusions. Yet in another embodiment, the fluid channel 632c may have a plurality of flat surfaces.

By providing the fluid channel in communication with the fluid region 310 and the first cavity 312, two regions 310 may be in fluid communication with one another. Fluid may flow through the fluid channel 632c, and pressure equilibrium between the fluid region 310 and the first cavity 312 of the platen may be achieved. Sudden burst of flow of fluid between the fluid region 310 and the first cavity 312 may be avoided.

Figure 6B:
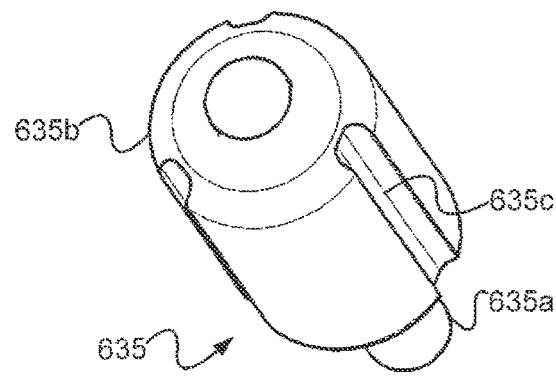
Figure 6C:
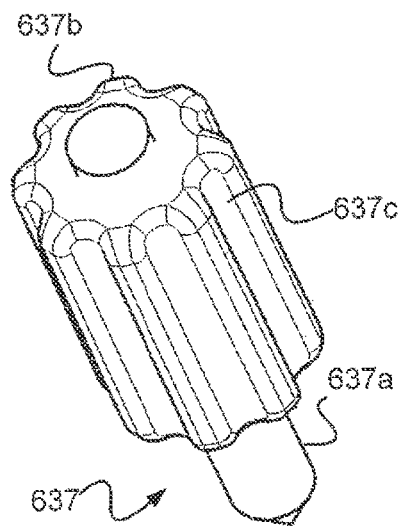

Referring to FIGS. 6B and 6C, there are shown isometric views of two other exemplary ground pin 635 and 637 according to other embodiments of the present disclosure. Each of the ground pins in FIGS. 6B and 6C is similar to the ground pin described earlier with FIG. 6A. In addition, the ground pins 635 and 637 are similar to one another. Each ground pins 635 and 637 comprises a pin body 635a, a sleeve 635b and 637b, and a fluid channel 635c, respectively.

Each of the ground pins 635 and 637, however, has different number of fluid channels 635c and 637c. For example, the ground pin 635 illustrated in FIG. 6B comprises three fluid channels 635c, and the ground pin 637 illustrated in FIG. 6C comprises eight fluid channels 637c. Each of the fluid channels 635c and 637c may enable fluid to flow between the fluid region 310 and the first cavity such that pressure equilibrium between two regions 310 and 312 may be achieved. Those of ordinary skill in the art will recognize that the number of the fluid channels is not limited in the present disclosure. The ground pin of the present disclosure may comprise a sleeve with any number of fluid channels.

Figure 6D:
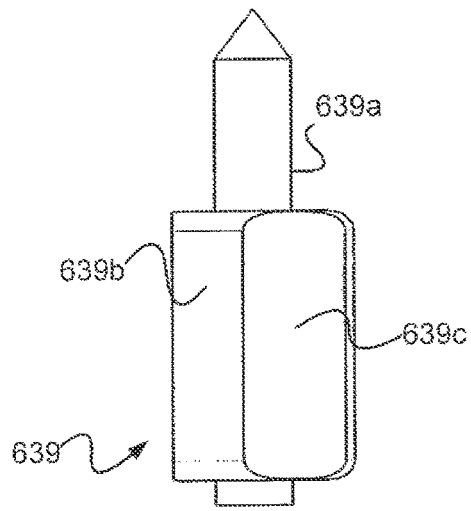

Referring to FIG. 6D, there is shown a view of another exemplary ground pin 639 according to another embodiment of the present disclosure. The ground pin shown in FIG. 6D is similar to the ground pin described earlier with FIG. 6A-6C. For example, the ground pin 639 comprises a pin body 639a, a sleeve 639b, and at least one fluid channel 639c. The fluid channel 639c, however, comprises a flat surface. In the present embodiment, the sleeve may have portions with cross sectional dimension that is greater than the cross sectional dimension of the first via 314.

With the ground pin 630 of the present embodiment, pressure equilibrium between the fluid region 310 and the first cavity 312 may be achieved even when the sleeve contacts the platen body (see FIG. 5). In addition, sudden bursts of fluid flow between the fluid region 310 and the first cavity 312, which may disturb and distribute the debris, may be avoided.

Figure 7A:
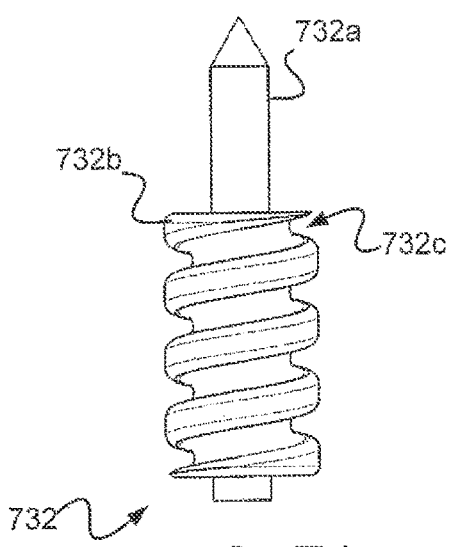
FIGS. 7A and 7B are views of another exemplary ground pin that can be incorporated into the platens illustrated in FIG. 3-5 according to another embodiment of the present disclosure.
Figure 7B:
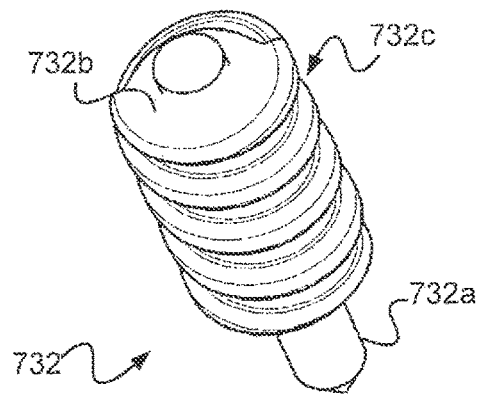

Referring to FIGS. 7A and 7B, there are shown another exemplary ground pin 732 according to another embodiment of the present disclosure. Similar to the ground pins of earlier embodiments, the ground pin 732 of the present embodiment may also be incorporated into the platen illustrated in FIGS. 3, 4, and 5.

In the present embodiment, the ground pin 732 may comprise a pin body 732a, a sleeve 732b, and a fluid channel 732c. In the present embodiment, the fluid channel 732c may have a helical shape. Although FIGS. 7A and 7B illustrate a helical fluid channel 732c with several windings, those of ordinary skill in the art will recognize that the helical fluid channel 732c may have one or less than one winding. The fluid channel 732c may preferably have an opening that is in fluid communication with the fluid region 310 and the first cavity 312. In the process, pressure equilibrium may be achieved even when the sleeve contacts the platen (see FIG. 5). In addition, sudden bursts of fluid flow between the fluid region 310 and the first cavity 312, which may disturb and distribute the debris, may be avoided.

Figure 8:
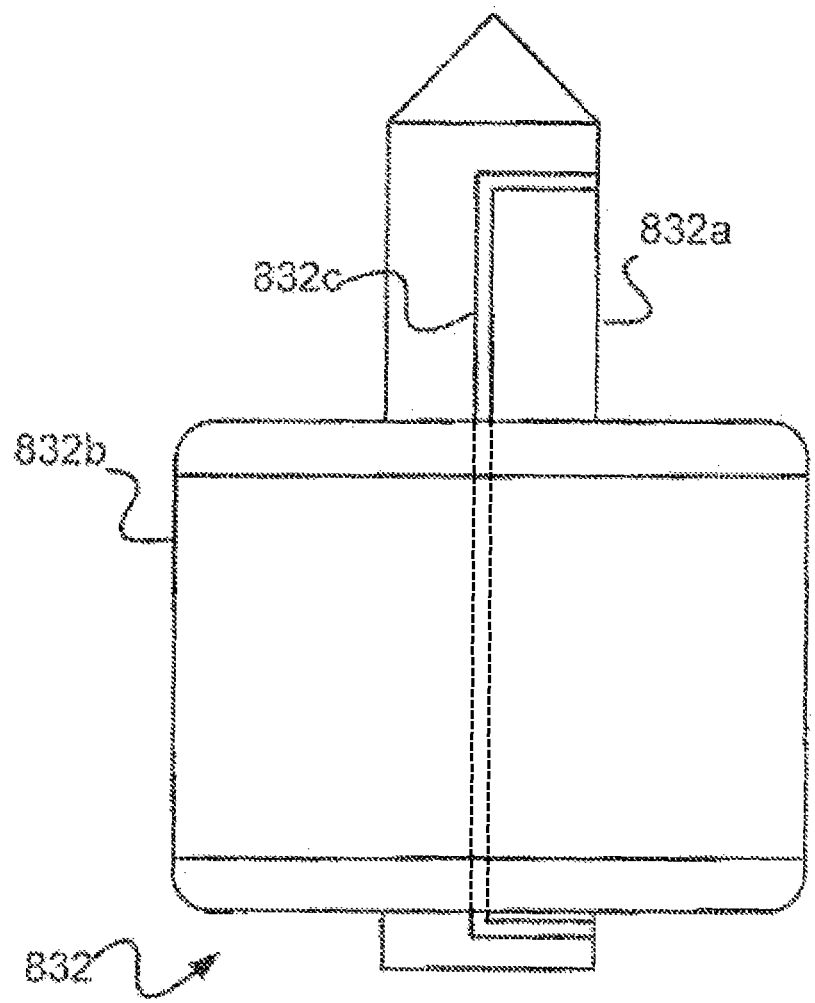
FIG. 8 is a view of another exemplary ground pin that can be incorporated into the platens illustrated in FIG. 3-5 according to another embodiment of the present disclosure The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

Referring to FIG. 8, there is shown another exemplary ground pin 832 according to another embodiment of the present disclosure. Similar to the ground pins of other embodiments, the ground pin 832 of the present embodiment may also be incorporated into the platen illustrated in FIGS. 3, 4, and 5.

The ground pin 832 comprises a ground pin 832a, a sleeve 832b, and a fluid channel 832c. The sleeve 832b may be similar to those described in earlier embodiments. In the present embodiment, the fluid channel 832c may be provided in the pin body 832a. Through the fluid channel 832c, fluid may flow between the fluid region 310 and the first cavity 312, and pressure equilibrium between two regions 310 and 312 may be achieved. In addition, sudden bursts of fluid flow between the fluid region 310 and the first cavity 312, which may be attributable to intermittent separation of the sleeve 732b and the platen and which may distribute contaminants to the substrate, may be avoided.

Several embodiments of a platen for reducing particle contamination on a substrate while processing the substrate and a method thereof are disclosed. Those of the art will recognize that the present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. For example, the present disclosure may be equally applicable to other types of substrate support, and components thereof, in system that performs a process other than ion implantation. In particular, the present disclosure may also be applicable to system performing an etch process, deposition process, annealing process, or other optical processes. In addition, the present disclosure may be equally applicable to a substrate support having a plurality regions, where one of the regions experience sudden bursts of fluid flowing from another, different regions. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A platen for supporting a substrate during processing of the substrate, the platen comprising:
 a platen body comprising first and second recesses, the first recess defining a fluid region for holding fluid for maintaining a temperature of the substrate at a desired temperature, the second recess defining a first cavity for holding a ground circuit; and
 a first via defined in the platen body, the first via having first and second openings, the first opening proximate to the fluid region and the second opening proximate to the first cavity, wherein a pressure level of the fluid region is maintained at a level that is substantially equal to a pressure level of the first cavity.

2. The platen according to claim 1, wherein the fluid region is in pressure equilibrium with the first cavity.

3. The platen according to claim 1, wherein the fluid region is in fluid communication with the first cavity.

4. The platen according to claim 3, further comprising: a fluid channel, wherein the fluid region is in fluid communication with the first cavity through the fluid channel.

5. The platen according to claim 4, wherein the fluid channel is provided in the platen body.

6. The platen according to claim 4, wherein the fluid channel is provided in the ground circuit.

7. The platen according to claim 6, wherein the ground circuit comprises a ground pin having a pin body and a sleeve, wherein the fluid channel is provided in the sleeve.

8. The platen according to claim 6, wherein the ground circuit comprises a ground pin having a pin body and a sleeve, wherein the fluid channel is provided in the pin body.

9. The platen according to claim 6, wherein the ground circuit comprises a ground pin having a pin body and a sleeve, wherein the sleeve includes pores, and wherein the pores provide a plurality of fluid channels through the sleeve.

10. The platen according to claim 7, wherein the fluid channel is in a form of a groove.

11. The platen according to claim 6, wherein the ground circuit comprises a ground pin having a pin body and a sleeve, wherein the fluid channel is in a form of a groove, and wherein the groove is provided in the sleeve.

12. The platen according to claim 11, wherein the groove extends in one direction.

13. The platen according to claim 11, wherein the groove is a helical groove.

* * * * *